United States Patent
Tan et al.

(10) Patent No.: US 12,242,962 B2
(45) Date of Patent: Mar. 4, 2025

(54) OPTIMAL RESCUE ORBITAL ELEMENTS ONLINE DECISION-MAKING METHOD BASED ON RBFNN FOR LAUNCH VEHICLES UNDER THRUST DROP FAULT

(71) Applicant: DALIAN UNIVERSITY OF TECHNOLOGY, Dalian (CN)

(72) Inventors: Shujun Tan, Dalian (CN); Xiao He, Dalian (CN); Liyong Zhang, Dalian (CN); Zhigang Wu, Dalian (CN)

(73) Assignee: DALIAN UNIVERSITY OF TECHNOLOGY, Dalian (CN)

( * ) Notice: Subject to any disclaimer, the term of this patent is extended or adjusted under 35 U.S.C. 154(b) by 953 days.

(21) Appl. No.: 17/330,790

(22) Filed: May 26, 2021

(65) Prior Publication Data

US 2022/0147820 A1   May 12, 2022

(30) Foreign Application Priority Data

Nov. 12, 2020   (CN) .......................... 202011262295.1

(51) Int. Cl.
*G06N 3/08* (2023.01)
*B64G 1/00* (2006.01)
(Continued)

(52) U.S. Cl.
CPC .............. *G06N 3/08* (2013.01); *B64G 1/242* (2013.01); *B64G 1/247* (2023.08); *G06N 3/04* (2013.01);
(Continued)

(58) Field of Classification Search
None
See application file for complete search history.

(56) References Cited

U.S. PATENT DOCUMENTS 9,849,785 B1 * 12/2017 Ross ...................... B64G 1/286
11,292,617 B1 * 4/2022 Gilkey .................. B64G 1/002
(Continued)

OTHER PUBLICATIONS

Z. Song et al.; Joint dynamic optimization of the target orbit and flight trajectory of a launch vehicle based on state-triggered indices; Acta Astronautica, 174(2020); pp. 82-93; Apr. 18, 2020.
(Continued)

*Primary Examiner* — Lail A Kleinman
(74) *Attorney, Agent, or Firm* — HAUPTMAN HAM, LLP

(57) ABSTRACT

An optimal rescue orbital elements online decision-making method based on RBFNN for launch vehicles under thrust drop fault includes establishing the flight dynamic equations of launch vehicles in the second-stage ascending phase in the geocentric inertial coordinate system, to construct a series of optimization problems of maximum semi-major axis of circular orbit under the thrust drop fault. The method further includes using the adaptive pseudo-spectrum method to solve the optimization problems of maximum semi-major, and using the maximum and minimum method to normalize the sample data to [−1, 1], using the orthogonal least square method to select the data center of the radial basis function neural network (RBFNN), where the Gaussian function is selected as the radial basis function, and the RBFNN is trained offline to establish a nonlinear mapping relationship from the fault states to the optimal rescue orbital elements.

2 Claims, 2 Drawing Sheets

(51) Int. Cl.
  *B64G 1/24*  (2006.01)
  *B64G 1/52*  (2006.01)
  *G06N 3/04*  (2023.01)
(52) U.S. Cl.
  CPC ............ *B64G 1/002* (2013.01); *B64G 1/2427* (2023.08); *B64G 1/52* (2013.01)

(56) References Cited

U.S. PATENT DOCUMENTS

2014/0379176 A1* 12/2014 Ross .................... B64G 1/244
                                                            701/3
2021/0403182 A1* 12/2021 Weiss .................. B64G 1/6462

OTHER PUBLICATIONS

Y Li et al.; Online trajectory optimization for power system fault of launch vehicles via convex programming; Aerospace Science and Technology; ,98(2020)p. 1; pp. 1-10; Jan. 8, 2020.

* cited by examiner (a) Semi-major axis  (b) Inclination  (c) Longitude of the ascending node of the rescue orbit

OPTIMAL RESCUE ORBITAL ELEMENTS ONLINE DECISION-MAKING METHOD BASED ON RBFNN FOR LAUNCH VEHICLES UNDER THRUST DROP FAULT

RELATED APPLICATIONS

The present application claims priority from Chinese Application Number 202011262295.1, filed Nov. 12, 2020, the disclosure of which is hereby incorporated by reference herein in its entirety.

TECHNICAL FIELD

The present invention relates to the technical field of launch vehicles under thrust drop fault, in particular to an optimal rescue orbital elements online decision-making method based on RBFNN for launch vehicles under thrust drop fault.

BACKGROUND

As a rocket power plant, the engine is a decisive factor for the reliability and safety of a rocket. Its reliability is related to the success or failure of the entire flight mission. In the actual flight mission, when the thrust drop fault of the launch vehicle engine occurs, it is difficult to complete the mission if the guidance and control scheme under nominal ballistic conditions is continued. In order to avoid the fall of the payload, it is necessary to decide the optimal rescue orbital elements online according to the fault state so that the payload enters into the rescue orbit.

At present, for the problem of online rescue under the thrust drop failure, the main idea is to couple the two problems of rescue trajectory decision and trajectory optimization based on the dynamic model for online optimization [1,2]. SONG [1] proposed an autonomous rescue strategy and algorithm for launch vehicle thrust descent failure, combined with the injection point geocentric angle estimation, convex optimization, adaptive collocation method, etc., to provide a good online solution for the original coupling optimization problem, online providing a good initial value for the original coupling optimization problem to improve the computational efficiency of online trajectory planning LI [2] proposed an online trajectory optimization algorithm for launch vehicles based on convex optimization to obtain a high-precision and high-efficiency online trajectory optimization method. The above method couples the two problems of rescue trajectory decision and flight trajectory together and optimizes them. Due to the unknown rescue orbit, the search space of the optimal solution is very large, which affects the calculation efficiency of the online part.

SUMMARY

According to the problems exist in the prior art, the present invention provides an optimal rescue orbital elements online decision-making method based on RBFNN for launch vehicles under thrust drop fault, specifically comprising:

establishing the dynamic equations of launch vehicles in the second-stage ascending phase in the geocentric inertial coordinate system; setting the boundary condition and the constraint condition with different fault times and thrust drop percentages, to construct a series of optimization problems of maximum semi-major axis of circular orbit under the thrust drop fault;

using the adaptive pseudo-spectral method (APM) to solve the optimization problems of maximum semi-major axis offline, to obtain a sample set of the optimal rescue orbital elements under different fault states, wherein the input feature of the sample set is the fault state, and the fault state includes the time of the thrust fault, the percentage of thrust drop, the position, the speed, the mass and the output features of the sample set are the orbital elements of the rescue orbit, the orbital elements of the rescue orbit includes the semi-major axis, the inclination, and the longitude of the ascending node of the rescue orbit;

using the maximum-minimum method to normalize the sample data, and all data are normalized to $[-1,1]$;

using the orthogonal least square method to select a data center of a radial basis function neural network (RBFNN), wherein a Gaussian basis function is selected as the radial basis function; the radial basis function neural network is trained offline to establish a nonlinear mapping relationship from the fault state to the optimal rescue orbital elements;

transferring the well-trained radial basis function neural network to the actual flight; taking the fault state of as the input of the radial basis function neural network, determining the optimal rescue orbital elements online.

Furthermore, when constructing the optimization problems of maximum semi-major axis:

setting the $X_1$ axis to point the primary meridian at the time of launch in an equatorial plane, the $Z_1$ axis vertical to the equatorial plane and to point the North Pole, and the $Y_1$ axis to meet the right-hand rule; establishing the dynamic equations of the launch vehicles in the second-stage ascending phase in the geocentric inertial coordinate system as follows:

$$\dot{r} = v \qquad (1)$$

$$\dot{v} = -\frac{\mu}{\|r\|^3}r + \frac{(1-\eta)T_{nom}}{m}u \qquad (2)$$

$$\dot{m} = -\frac{(1-\eta)T_{nom}}{g_0 I_{sp}} \qquad (3)$$

wherein r and v represent the position and the velocity vector of launch vehicles; $\mu$=GM is an earth's gravitational constant; m represents a total mass of the launch vehicles, and $I_{sp}$ represents a specific impulse of the engine of the launch vehicles; $u=[u_x,u_y,u_z]^T$ is a component of a thrust unit vector of the engine; when the engine fault occurs, a percentage of thrust drop is $\eta$; a thrust magnitude is $(1-\eta)T_{nom}$, wherein $T_{nom}$ is a nominal thrust of the engine; in the case of a thrust drop fault, the specific impulse of the engine remains unchanged, a propellant consumption per second decreased $\eta$, and a total flight time exceeds a nominal flight time; assuming the engine thrust drop failure occurs at $t_0$, so the constraint condition of the starting point is expressed as follow:

$$x(t_0)=x_0 \qquad (4)$$

wherein $x_0$ is the state of the starting point, a nonlinear relationship from the number of orbital elements to a terminal state is expressed as $$[a_f, e_f, i_f, \Omega_f, \omega_f]^T = \psi(r(t_f), v(t_f)) \qquad (5)$$

wherein $t_f$ is a terminal moment; $a_f, e_f, i_f, \Omega_f, \omega_f$ is the orbital elements of the target orbit including the semi-major axis, eccentricity, inclination, longitude of the ascending node, argument perigee of the terminal point.

a total mass of the launch vehicle and payload after the fuels exhaustion is expressed as $m_f$, the radius of the earth is $R_0$, and the minimum safe orbit height is defined as $h_{safe}$, the terminal mass and the height meets:

$$m(t_f) \geq m_f, h_{safe} \leq r(t_f) - R_0 \quad (6)$$

when the thrust drop fault occurs, because an energy required to send a load into a circular orbit is less than an energy of an elliptical orbit under a same perigee height, so searching for a highest circular orbit within the current orbital plane as the optimal rescue orbital elements; describing, by the solution to the highest circular orbit under the thrust drop failure, the maximum optimization problem of the semi-major axis:

Objective Function: min $J = -a(t_f)$

Boundary Conditions: $[e_f, i_f, \Omega_f]^T = [0, i_f^{res}, \Omega_f^{res}]^T$, $x(t_0) = x_0, m(t_f) \geq m_f, h_{safe} \leq r(t_f) - R_0$ Dynamics Constraints: Eq. (1)-(3)

Control Constraints: $\|u\| = 1$

The orbital inclination $i_f^{res}$ and the longitude of the ascending node $\Omega_f^{res}$ is in accordance with the fault states of launch vehicles. Due to the above technical scheme, the present invention provides an optimal rescue orbital elements online decision-making method based on RBFNN for launch vehicles under thrust drop fault, which has the following beneficial effects:

(1) Benefiting from the invention, the complicated trajectory optimization problem of launch vehicles under the thrust drop fault is decoupled into an optimal rescue orbital elements decision-making and a simplified trajectory optimization problem.

(2) RBFNN can fit the nonlinear relationship from the optimal rescue orbital elements to the fault states accurately. The online decision-making time is almost negligible compared with trajectory optimization time.

(3) The invention can quickly determine the optimal rescue orbital elements online and provide reasonable terminal constraints for subsequent online trajectory optimization. Then the complexity of the online trajectory optimization problem will also be greatly reduced, thereby improving the overall computational efficiency of online rescue.

BRIEF DESCRIPTION OF THE DRAWINGS

In order to explain more clearly the embodiment of this application or the technical scheme in the prior art, a brief description of the attached drawings required in the specific embodiment or the existing technical description is given below. Obviously, the attached drawings in the following description are only some of the embodiments recorded in this application. For general technical personnel in this field, other drawings can be obtained without creative work.

DETAILED DESCRIPTION

In order to make the technical scheme and advantages of the invention clearer, a clear and complete description of the technical scheme in the embodiments of the invention will be described in conjunction with drawings attached in the embodiments of the invention hereinafter.

Figure 1:
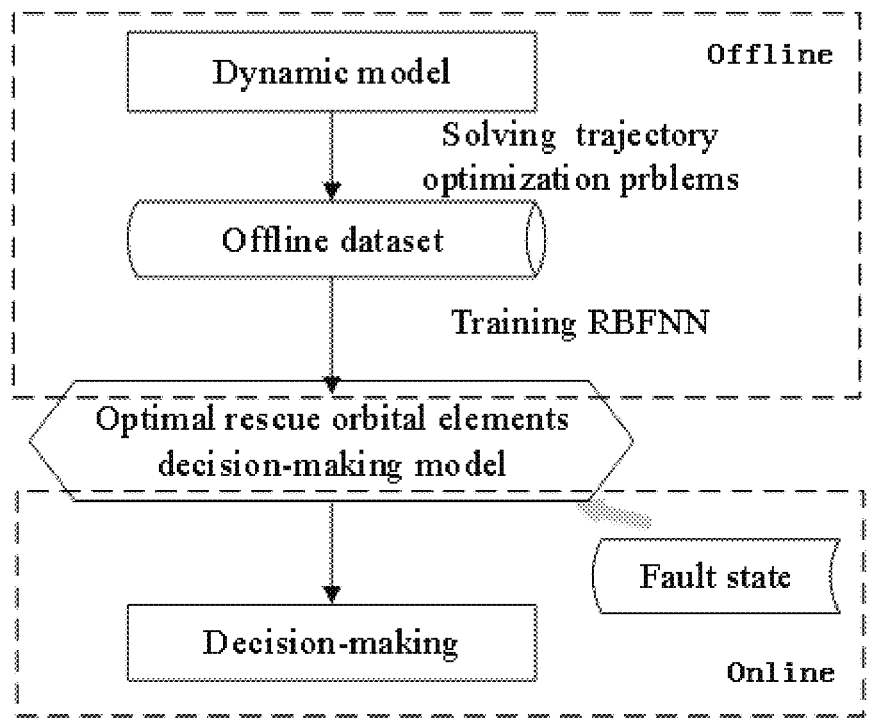
FIG. 1 shows the scheme of the optimal rescue orbital elements decision-making strategy.

FIG. 1 shows an optimal rescue orbital elements online decision-making method based on RBFNN for launch vehicles under a thrust drop fault, specifically steps are as follows:

S1: Taking the two-stage launch vehicle as the research object, it is assumed that the thrust drop failure occurs in the second stage of flight. At this time, the atmosphere is thin and the influence of aerodynamic forces can be ignored. Define the geocentric inertial coordinate system: the origin is at the center of the earth, the X1 axis points to the primary meridian at the time of launch in the equatorial plane, the Z1 axis is vertical to the equatorial plane and points to the North Pole, and the Y1 axis satisfies the right-hand rule, respectively. Establishing the dynamic equations of the launch vehicles in the second-stage ascending phase in the geocentric inertial coordinate system as follows:

$$\dot{r} = v \quad (1)$$

$$\dot{v} = -\frac{\mu}{\|r\|^3} r + \frac{(1-\eta)T_{nom}}{m} u \quad (2)$$

$$\dot{m} = -\frac{(1-\eta)T_{nom}}{g_0 I_{sp}} \quad (3)$$

wherein r and v represent the position and the velocity vector of launch vehicles; $\mu = GM$ is an earth's gravitational constant; m represents a total mass of the launch vehicles, and $I_{sp}$ represents a specific impulse of the engine of the launch vehicles; $u = [u_x, u_y, u_z]^T$ is a component of a thrust unit vector of the engine; when the engine fault occurs, a percentage of thrust drop is $\eta$; a thrust magnitude is $(1-\eta)T_{nom}$, wherein $T_{nom}$ is a nominal thrust of the engine; in the case of a thrust drop fault, the specific impulse of the engine remains unchanged, a propellant consumption per second decreased $\eta$, and a total flight time exceeds a nominal flight time; assuming the engine thrust drop failure occurs at $t_0$, so the constraint condition of the starting point is expressed as follow:

$$x(t_0) = x_0 \quad (4)$$

wherein $x_0$ is the state of the starting point, a nonlinear relationship from the number of orbital elements to a terminal state is expressed as $$[a_f, e_f, i_f, \Omega_f, \omega_f]^T = \psi(r(t_f), v(t_f)) \quad (5)$$

wherein $t_f$ is a terminal moment; $a_f, e_f, i_f, \Omega_f, \omega_f$ is the orbital elements of the target orbit including the semi-major axis, eccentricity, inclination, longitude of the ascending node, argument perigee of the terminal point.

a total mass of the launch vehicle and payload after the fuels exhaustion is expressed as $m_f$, the radius of the earth is $R_0$, and the minimum safe orbit height is defined as $h_{safe}$, the terminal mass and the height meets:

$$m(t_f) \geq m_f, h_{safe} \leq r(t_f) - R_0 \quad (6)$$

when the thrust drop fault occurs, because an energy required to send a load into a circular orbit is less than an energy of an elliptical orbit under a same perigee height, so searching for a highest circular orbit within the current orbital plane as the optimal rescue orbital elements; describing, by the solution to the highest circular orbit under the thrust drop failure, the maximum optimization problem of the semi-major axis:

Objective Function: min $J=-a(t_f)$

Boundary Conditions: $[e_f, i_f, \Omega_f]^T = [0, i_f^{res}, \Omega_f^{res}]^T$, $x(t_0) = x_0, m(t_f) \geq m_f, h_{safe} \leq r(t_f) - R_0$ Dynamics Constraints: Eq. (1)-(3)

Control Constraints: $\|u\|=1$

The orbital inclination $i_f^{res}$ and the longitude of the ascending node $\Omega_f^{res}$ is in accordance with the fault states of launch vehicles.

Figure 2:
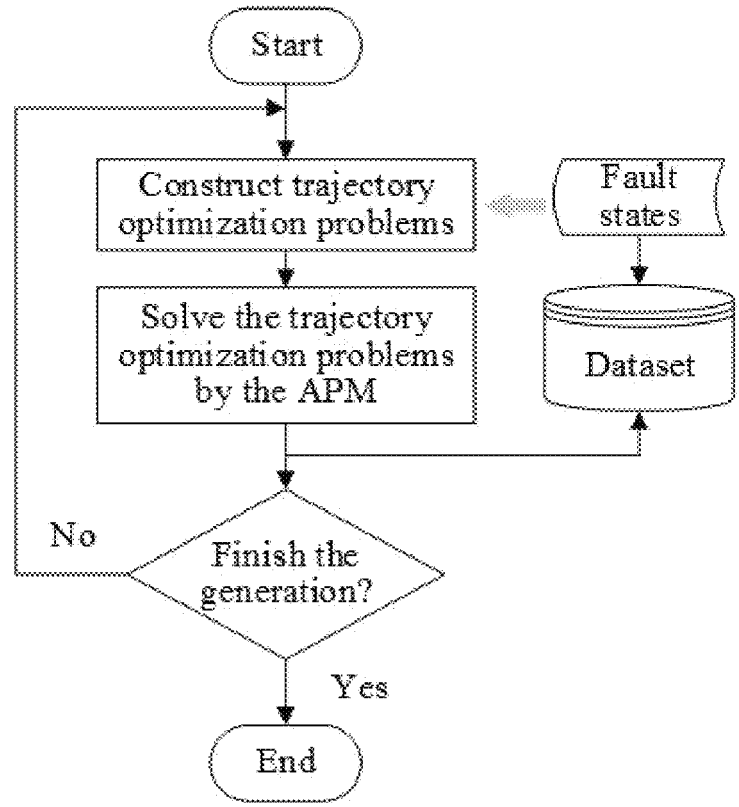
FIG. 2 shows the flow chart of sample set generation.

S2: In the actual flight, the position, speed and mass of the rocket are merely near the nominal trajectory due to the noise disturbance. Therefore, the state of the fault is the time when the fault occurs, the size, location, speed, and mass of the thrust drop. Traverse different fault states, construct the optimization problem, and use the adaptive pseudo-spectrum method to solve the optimization problem, as shown in FIG. 2. The sample set of optimal rescue orbital elements versus fault states is the training date for RBFNN.

S3: The data of sample set are normalized into the range [−1 . . . 1] in order to eliminate the order of the magnitude difference between the data of each dimension and avoid the large prediction error caused by the large magnitude difference between the input and output data. The orthogonal least square method is used to select the RBF network data center, and the nonlinear mapping the relationship from the fault state to the optimal rescue orbital elements is established.

The hidden unit is activated by the basis function, the Gaussian basis function is used in present application. The output of j-th hidden layer is:

$$\varphi_{ij} = \exp\left(-\frac{\|x_{RBFNN}^{(i)} - \mu_j\|^2}{2\sigma_j^2}\right) \quad (7)$$

wherein $x_{RBFNN}^{(i)}$ is the i-th input data. $\mu_j$ is the center of the basis function of the hidden node, and $\sigma_j$ is the expansion speed of the radial basis function. The center of the basis function and the expansion speed are determined by the training of the network. The output layer linearly combines the output of the hidden layer of the radial basis function to generate the expected output. The output of the k th node in the output layer is $$y_k^{(i)} = \sum_{j=1}^{M} w_{jk} \varphi_{ij} \quad (k=1, \ldots, S) \quad (8)$$

Wherein $w_{jk}$ is the weight from the j th hidden layer neuron to the k output neuron. In order to achieve appropriate approximation accuracy, the following parameters are determined through training: the number of hidden layer neurons, the center of the basis function of each hidden layer neuron, and the weight of the radial basis function output passed to the summation layer.

S4: The well-trained RBFNN is transferred to online application for decision-making of the optimal rescue orbital elements, taking the fault states of the actual flight as the input, can quickly determine the optimal rescue orbital elements online.

Example

Figure 3:
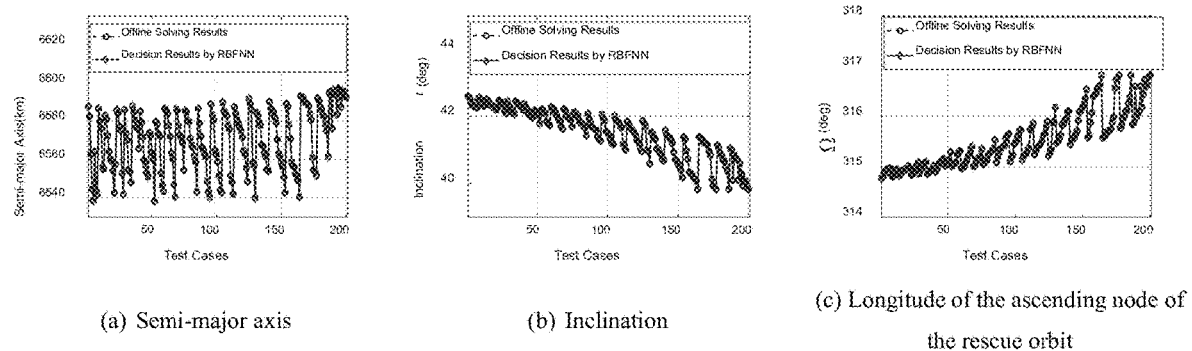
FIG. 3 shows the results of the optimal rescue orbital elements decision-making.

In this section, simulation verification is conducted in the entire second stage flight phase of a launch vehicle, and the parameters are from reference [1]. The state distribution of the faults established by the sample set is based on the fault time is incremented by 1 s from 0 s to 375 s, and the proportion of thrust-drop is incremented by 1% from 13% to 40%. In the sample set, 90% of the data is randomly selected as the training set, and the remaining 10% of the data is used as the test set. A radial basis function neural network is used to establish a nonlinear mapping from the fault state to the optimal rescue orbital elements. The spread factor of RBF neural network training is 1, and the final number of trained hidden layer neurons is 50. In the test set, the optimal rescue orbital elements are determined by the RBF neural network are shown in FIG. 3. The error of the semi-major axis decision is [−0.148, 0.774 km], and the relative error is within 0.015%. The error of orbital inclination and the longitude of the ascending node is within ±$10^{-4}$ deg, and the maximum relative error is within $10^{-5}$.

TABLE 1

RMSE of different machine learning models

| No. | Mechanism learning model | RMSE (km) |
| --- | --- | --- |
| 1 | Linear regression | 3.854 |
| 2 | Decision tree | 1.214 |
| 3 | SVM (Gauss) | 1.214 |
| 4 | SVM (Cubic) | 1.111 |
| 5 | Gaussian process regression | 0.129 |
| 6 | Radial basis function neural network | 0.105 |

Table 1 is a comparison of the root mean square error (RMSE) of the results of different machine learning methods. The RMSE obtained by linear regression is larger than that of the nonlinear regression method, because the relationship from the fault state to the optimal rescue orbital elements are nonlinear, and it is suitable to use the nonlinear function approximation method. Compared with several other machine models, the RBF neural network model has a smaller RMSE, which means that it has a better function approximation effect in mapping the relationship from the fault state to the optimal rescue orbital elements.

The above is the preferred implement approach of the invention, the protection range is not limited to what mentioned above. Any technician who is familiar with this technical field replaces or revises technical schemes and inventive created on the basis of the present invention within the technical scope disclosed in this invention, schemes and inventive should be involved in the protection range of this invention.

[1] Z. Song, C. Wang, Q. Gong, Joint dynamic optimization of the target orbit and flight trajectory of a launch vehicle based on state-triggered indices, Acta Astronaut, 174 (2020) 82-93.

[2] Y. Li, B. J. Pang, C. Z. Wei, N. GCui, Y. B. Liu, Online trajectory optimization for power system fault of launch vehicles via convex programming, Aerosp. Sci. Technol., 98(2020) P. 1 (1-10).

The invention claimed is:

1. An optimal rescue orbital elements online decision-making method based on RBFNN for launch vehicles under thrust drop fault, comprising:

establishing dynamic equations of launch vehicles in a second-stage ascending phase in a geocentric inertial coordinate system; setting a boundary condition and a constraint condition with different fault times and thrust drop percentages, to construct a series of optimization problems of maximum semi-major axis of circular orbit under the thrust drop fault;

using an adaptive pseudo-spectral method (APM) to solve the optimization problems of maximum semi-major axis offline, to obtain a sample set of the optimal rescue orbital elements under different fault states, wherein input features of the sample set are the fault states, and the fault states include a time of a thrust fault, a percentage of thrust drop, a position, a speed, a mass and output features of the sample set are the rescue orbital elements, the rescue orbital elements include the semi-major axis, an inclination, and a longitude of an ascending node of a rescue orbit;

using a maximum-minimum method to normalize a sample data, and all data are normalized to [−1,1]; using an orthogonal least square method to select a data center of a radial basis function neural network (RBFNN), wherein a Gaussian basis function is selected as a radial basis function; the radial basis function neural network is trained offline to establish a nonlinear mapping relationship from the fault states to the optimal rescue orbital elements; and transferring the well-trained radial basis function neural network to an actual flight; taking a fault state of the actual flight as an input of the radial basis function neural network, to determine the optimal rescue orbital elements online.

2. The method according to claim 1, wherein, when constructing the optimization problems of maximum semi-major axis:

setting an $X_1$ axis to point a primary meridian at a time of launch in an equatorial plane, a $Z_1$ axis vertical to the equatorial plane and point to a North Pole, and a $Y_1$ axis to meet a right-hand rule; establishing the dynamic equations of the launch vehicles in the second-stage ascending phase in the geocentric inertial coordinate system as follows:

$$\dot{r} = v \quad (1)$$

$$\dot{v} = -\frac{\mu}{\|r\|^3}r + \frac{(1-\eta)T_{nom}}{m}u \quad (2)$$

$$\dot{m} = -\frac{(1-\eta)T_{nom}}{g_0 I_{sp}} \quad (3)$$

wherein r and v represent a position and a velocity vector of launch vehicles; $\mu$=GM is an earth's gravitational constant; m represents a total mass of the launch vehicles, and $I_{sp}$ represents a specific impulse of an engine of the launch vehicles; $\mu=[u_x, u_y, u_z]^T$ is a component of a thrust unit vector of the engine; when an engine fault occurs, a percentage of thrust drop is $\eta$; a thrust magnitude is $(1-\eta)T_{nom}$, wherein $T_{nom}$ is a nominal thrust of the engine; in the case of a thrust drop fault, a specific impulse of the engine remains unchanged, a propellant consumption per second decreased $\eta$, and a total flight time exceeds a nominal flight time; assuming an engine thrust drop failure occurs at $t_0$, so a constraint condition of a starting point is expressed as follow:

$$x(t_0)=x_0 \quad (4)$$

wherein $x_0$ is a state of the starting point, a nonlinear relationship from a number of orbital elements to a terminal state is expressed as $$[a_f, e_f, i_f, \Omega_f, \omega_f]^T = \psi(r(t_f), v(t_f)) \quad (5)$$

wherein $t_f$ is a terminal moment; $a_f, e_f, i_f, \Omega_f, \omega_f$ are orbital elements of a target orbit including a semi-major axis, an eccentricity, an inclination, a longitude of an ascending node, an argument perigee of a terminal point, a total mass of the launch vehicle and payload after fuels are exhausted is expressed as $m_f$, a radius of the earth is $R_0$, and a minimum safe orbit height is defined as $h_{safe}$, a terminal mass and a height meets:

$$m(t_f) \geq m_f, h_{safe} \leq r(t_f) - R_0 \quad (6)$$

when the thrust drop fault occurs, because an energy required to send a load into a circular orbit is less than an energy of an elliptical orbit under a same perigee height, so searching for a highest circular orbit within a current orbital plane as the optimal rescue orbital elements; describing, by a solution to the highest circular orbit under a thrust drop failure, a maximum optimization problem of the semi-major axis:

Objective Function: $\min J = -a(t_f)$

Boundary Conditions: $[e_f, i_f, \Omega_f]^T = [0, i_f^{res}, \Omega_f^{res}]^T$, $x(t_0) = x_0, m(t_f) \geq m_f, h_{safe} \leq r(t_f) - R_0$ Dynamics Constraints: Eq. (1)-(3)

Control Constraints: $\|u\|=1$; and determining the orbital inclination $i_f^{res}$ and the longitude of the ascending node $\Omega_f^{res}$, according to the fault states of launch vehicles.

* * * * *